(12) United States Patent
Kamada

(10) Patent No.: US 8,247,875 B2
(45) Date of Patent: Aug. 21, 2012

(54) FABRICATION METHOD OF SEMICONDUCTOR DEVICE

(75) Inventor: Hiroyuki Kamada, Toyama (JP)

(73) Assignee: Panasonic Corporation, Osaka (JP)

( * ) Notice: Subject to any disclaimer, the term of this patent is extended or adjusted under 35 U.S.C. 154(b) by 137 days.

(21) Appl. No.: 12/942,503

(22) Filed: Nov. 9, 2010

(65) Prior Publication Data

US 2011/0049644 A1  Mar. 3, 2011

Related U.S. Application Data

(62) Division of application No. 12/362,326, filed on Jan. 29, 2009, now Pat. No. 7,851,316.

(30) Foreign Application Priority Data

Jan. 30, 2008  (JP) ................................. 2008-018856

(51) Int. Cl.
    *H01L 21/00*  (2006.01)
(52) U.S. Cl. . 257/397; 257/402; 257/408; 257/E21.336; 257/E21.618; 257/E29.255
(58) Field of Classification Search .................. 257/344, 257/371, 397, 402, 408, E21.336, 345, 409, 257/618, 619, 29.063, 255
    See application file for complete search history.

(56) References Cited

U.S. PATENT DOCUMENTS

| | | | |
|---|---|---|---|
| 5,675,172 A | 10/1997 | Miyamoto et al. | |
| 5,710,055 A | 1/1998 | Kizilyalli | |
| 6,087,208 A | 7/2000 | Krivokapic et al. | |
| 6,432,802 B1 | 8/2002 | Noda et al. | |
| 6,483,155 B1 * | 11/2002 | Wada et al. | 257/397 |
| 6,887,758 B2 | 5/2005 | Chindalore et al. | |
| 6,977,417 B2 | 12/2005 | Momiyama et al. | |
| 7,098,110 B2 | 8/2006 | Saiki | |
| 7,141,840 B2 | 11/2006 | Iwasaki et al. | |
| 7,211,516 B2 | 5/2007 | Chen et al | |
| 7,262,105 B2 | 8/2007 | Jawarani et al. | |
| 2006/0071278 A1 | 4/2006 | Takao | |
| 2006/0214198 A1 | 9/2006 | Matsuki et al. | |
| 2011/0241127 A1 * | 10/2011 | Hung et al. | 257/402 |

FOREIGN PATENT DOCUMENTS

| | | |
|---|---|---|
| JP | 11-016855 | 1/1999 |
| JP | 3033528 | 4/2000 |

OTHER PUBLICATIONS

The 63rd Annual Meeting of the Japanese Society of Microscopy, MG20-E-1430, with Partial English Translation.

* cited by examiner

*Primary Examiner* — Michael Lebentritt
(74) *Attorney, Agent, or Firm* — McDermott Will & Emery LLP

(57) ABSTRACT

A fabrication method of a semiconductor device includes: forming a gate insulating film and a gate electrode on an N type well; forming first source/drain regions by implanting a first element in regions of the N type well on both sides of the gate electrode, the first element being larger than silicon and exhibiting P type conductivity; forming second source/drain regions by implanting a second element in the regions of the N type well on the both sides of the gate electrode, the second element being smaller than silicon and exhibiting P type conductivity; and forming a metal silicide layer on the source/drain regions.

8 Claims, 5 Drawing Sheets

Junction Leakage Current from Source/Drain to Well

FABRICATION METHOD OF SEMICONDUCTOR DEVICE

CROSS-REFERENCE TO RELATED APPLICATIONS

This application is a Divisional of U.S. patent application Ser. No. 12/362,326, filed Jan. 29, 2009 now U.S. Pat. No. 7,851,316 and claims priority from Japanese Patent Application JP2008-018856 filed on Jan. 30, 2008, the entire contents of each of which are hereby incorporated by reference.

BACKGROUND OF THE INVENTION

A technology disclosed in this specification relates to a fabrication method of a semiconductor device, specifically to a method of forming a source/drain of a microfabricated P channel type MIS transistor in which nickel silicide is used.

In recent years, the structure in which impurity diffusion layers constituting source/drain regions are formed as thinly as possible has been adopted to suppress short-channel effects associated with the microfabrication of transistors. However, the reduction in depth of the impurity diffusion layers results in increase in sheet resistance of the impurity diffusion layers. As a result, it becomes difficult to achieve high-speed operation and low power consumption. Considering this, recent semiconductor devices adopt a silicide formation process in which a metal film is formed on a source/drain region and subjected to a heat treatment to make the metal and silicon react with each other and thereby form a silicide film. Many of the semiconductor devices whose gate length is 100 nm or less particularly adopt a nickel silicide formation process, which has the following advantages: (1) a nickel silicide film can be formed in a low temperature process (<600° C.) which suppresses deactivation of activated impurities and (2) nickel lends itself to formation of shallow junction because less silicon is consumed when nickel is used to react with silicon than other metals for forming silicide under the same sheet resistance.

A semiconductor device fabrication method utilizing a nickel silicide formation process is hereinafter described, with reference to FIG. 5. FIG. 5A to FIG. 5E are cross sections showing a conventional fabrication method of a semiconductor device.

First, as shown in FIG. 5A, an isolation region 1102 is formed in a silicon substrate 1101. Then, an N type well 1103a and a P type well 1103b are formed by photolithography and ion implantation.

Next, as shown in FIG. 5B, a gate oxide film is formed on the upper surface of the silicon substrate 1101 by thermal oxidation, and a non-doped polysilicon film is further formed on the gate oxide film. After that, photolithography and ion implantation are carried out to introduce boron in the non-doped polysilicon film above the N type well 1103a and phosphorus in the non-doped polysilicon film above the P type well 1103b. Then, photolithography and dry etching are carried out to form a gate oxide film 1104a and a P type gate electrode 1105a on the N type well 1103a, and a gate oxide film 1104b and an N type gate electrode 1105b on the P type well 1103b. After that, photolithography and ion implantation are carried out to introduce boron difluoride ($BF_2$) in regions of the N type well 1103a on both sides of the P type gate electrode 1105a, thereby forming P type extension regions 1106a, and introduce phosphorus, thereby forming N type pocket regions 1107a below the P type extension regions 1106a. Similarly, arsenic is introduced in regions of the P type well 1103b on both sides of the N type gate electrode 1105b to form N type extension regions 1106b, and boron is introduced to form P type pocket regions 1107b below the N type extension regions 1106b.

Then, as shown in FIG. 5C, a TEOS film and a silicon nitride film are formed on the silicon substrate 1101 in order. Etch back is then carried out by anisotropic etch to form a side wall 1110a composed of a TEOS film 1108a and a silicon nitride film 1109a on side surfaces of the gate oxide film 1104a and the P type gate electrode 1105a and form a side wall 1110b composed of a TEOS film 1108b and a silicon nitride film 1109b on side surfaces of the gate oxide film 1104b and the N type gate electrode 1105b.

Then, as shown in FIG. 5D, photolithography and ion implantation are carried out to introduce boron difluoride ($BF_2$) and boron in the N type well 1103a using a photoresist (not shown), the P type gate electrode 1105a and the side wall 1110a as a mask, thereby forming P type source/drain regions 1111a, and introduce arsenic and phosphorus in the P type well 1103b using a photoresist (not shown), the N type gate electrode 1105b and the side wall 1110b as a mask, thereby forming N type source/drain regions 1111b.

Then, as shown in FIG. 5E, the impurities introduced in the P type gate electrode 1105a, N type gate electrode 1105b, N type well 1103a and P type well 1103b are activated by a high-temperature, high-speed heat treatment. After that, the upper surface of the silicon substrate 1101 is cleaned with a hydrofluoric acid solution, thereby removing a natural oxide film on the surface of the substrate. Then, a nickel metal film and a titanium nitride metal film are formed on the silicon substrate 1101. The silicon substrate 1101 is subjected to a heat treatment in a nitrogen atmosphere to make the nickel and silicon react with each other. The nickel metal film and the titanium nitride metal film which have not reacted with silicon are removed with a solution in which sulfuric acid and hydrogen peroxide are mixed. The silicon substrate 1101 is again subjected to a heat treatment in a nitrogen atmosphere to form nickel silicide 1112 on the P type gate electrode 1105a, N type gate electrode 1105b, P type source/drain regions 1111a, and N type source/drain regions 1111b. A semiconductor device including a P channel type MOS transistor 1201 and an N channel type MOS transistor 1202 each having nickel silicide is obtained in this way.

However, the P channel type MOS transistor using the nickel silicide formed by the above method has a problem that a junction leakage current flowing from a P type source/drain region to a well increases. The cause was investigated and found to be the nickel silicide formed on the P type source/drain region and having an inverted pyramid shape that invades the P type source/drain region. FIG. 6 is an example of a cross sectional shape of the nickel silicide formed on the P type source/drain region (Reference: The 63rd Annual Meeting of the Japanese Society of Microscopy MG20-E-1430). This kind of abnormal growth of nickel silicide occurs only in a P channel type MOS transistor. Although it has not yet been determined what causes this phenomenon, the following two points are considered to be the cause of the phenomenon: (1) remnant crystal defects in the P type source/drain region before formation of silicide and (2) deformed silicon crystal which is deformed because the P type source/drain region includes a large amount of boron whose atomic radius is smaller than the atomic radius of silicon, and as a result, abnormal diffusion of nickel is apt to occur.

A method for suppressing the abnormal growth of silicide in the P channel type MOS transistor is disclosed in Japanese Patent No. 3033528, for example. The method disclosed is a semiconductor device fabrication method including a step of forming titanium silicide on a silicon crystal containing an impurity element whose atomic radius is smaller than the atomic radius of silicon. In this method, the above impurity element is introduced in a silicon crystal containing an element whose atomic radius is greater than the atomic radius of silicon and which does not cause chemical reaction with silicon and does not generate a level in the silicon. By doing so, distortion of the silicon crystal is corrected. A titanium film is then formed on the silicon crystal and the silicon crystal with the titanium film is annealed to form titanium silicide.

SUMMARY OF THE INVENTION

However, when argon is selected as an element whose atomic radius is greater than that of silicon and which does not cause chemical reaction with silicon and does not generate a level in the silicon for forming nickel silicide by the above method, no improvement was found in the junction leakage current flowing from the P type source/drain region to the well in the P channel type transistor, and no effect was found in the nickel silicide formation process.

Another solution for the above problem may be to form the P type source/drain region deeper than the depth of the abnormally-grown nickel silicide. However, as mentioned earlier, it is difficult to increase the depth of a source/drain of a microfabricated transistor because of the need to reduce the depth of an impurity diffusion layer, which constitutes the source/drain and the like, to suppress short-channel effects.

The present invention was made to solve the above problem. An object of the present invention is to provide a fabrication method of a semiconductor device in which abnormal growth of silicide during formation of the silicide is suppressed in a P channel type MOS transistor, thereby suppressing increase in junction leakage current flowing from a source/drain region to a well, while maintaining shallow junction of the source/drain region.

A semiconductor device fabrication method of the present invention is a fabrication method of a semiconductor device which has a P channel type MIS transistor including a gate insulating film, a gate electrode, source/drain regions composed of first source/drain regions and second source/drain regions, and a metal silicide layer, the fabrication method including: (a) preparing a semiconductor substrate including an N type well surrounded by an isolation region; (b) forming the gate electrode on the N type well, with the gate insulating film interposed therebetween; (c) forming the first source/drain regions by implanting a first element in regions of the N type well on both sides of the gate electrode, the first element being larger than silicon and exhibiting P type conductivity; (d) after (c) forming the second source/drain regions by implanting a second element in the regions of the N type well on the both sides of the gate electrode, the second element being smaller than silicon and exhibiting P type conductivity; and (e) forming the metal silicide layer on the source/drain regions.

According to this method, a silicon crystal is once made amorphous by implanting the first element, which is larger than silicon, during formation of the source/drain regions and then recrystallized by a subsequent heat treatment. Crystal defects remaining in the source/drain regions can be corrected by this process. Moreover, speed of diffusion at which the metal diffuses in the source/drain regions can be slowed down because a large amount of elements larger than silicon exists in the source/drain regions. As a result, it is possible to reduce a thickness of the nickel silicide film and suppress junction leakage current.

DESCRIPTION OF PREFERRED EMBODIMENT

Embodiment

An example of a semiconductor device fabrication method of the present invention is hereinafter described, with reference to the drawings. Although a P channel type MIS transistor and an N channel type MIS transistor are formed alternately in the transistor fabrication process, descriptions of a fabrication process of an N channel type MIS transistor is omitted here because the present invention relates to a fabrication method of a P channel type MIS transistor.

FIG. 1A to FIG. 1E are cross sections showing a fabrication method of a semiconductor device according to the first embodiment of the present invention. This semiconductor device includes a P channel type MOS transistor on an N type well 103a.

Figure 1A:
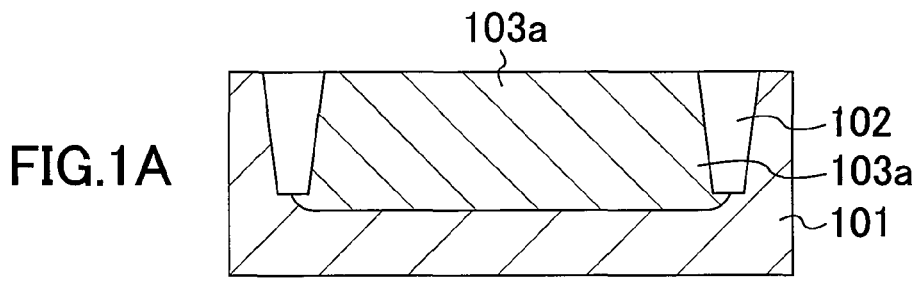
FIG. 1A to FIG. 1E are cross sections showing a fabrication method of a semiconductor device according to the first embodiment of the present invention.

First, as shown in FIG. 1A, an isolation region 102 composed of a buried insulating film or the like is formed in a semiconductor substrate 101 of silicon or the like. After that, the N type well 103a is formed by photolithography and ion implantation.

Figure 1B:
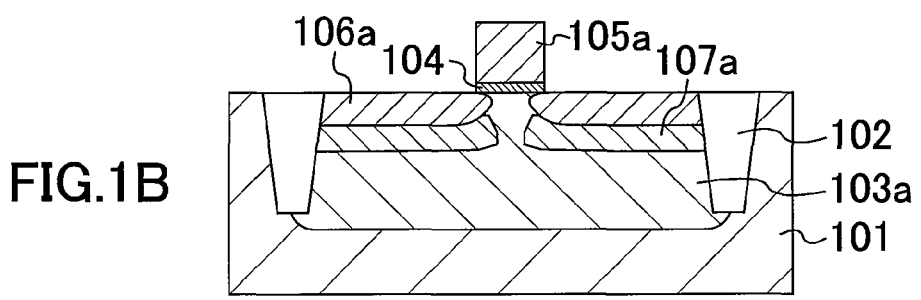

Then, as shown in FIG. 1B, a gate insulating film is formed on the upper surface of the semiconductor substrate 101 by thermal oxidation, and a non-doped polysilicon film is then formed on the gate insulating film. After that, photolithography and ion implantation are carried out to introduce boron in the non-doped polysilicon film above the N type well 103a. Photolithography and dry etching are then carried out, thereby forming on the N type well 103a a gate insulating film 104 and a P type gate electrode 105a which have a given width. Next, boron difluoride ($BF_2$) is introduced in regions of the N type well 103a on both sides of the P type gate electrode 105a, thereby forming P type extension regions 106a. Phosphorus is introduced in the P type extension regions 106a, thereby forming N type pocket regions 107a below the P type extension regions 106a.

Figure 1C:
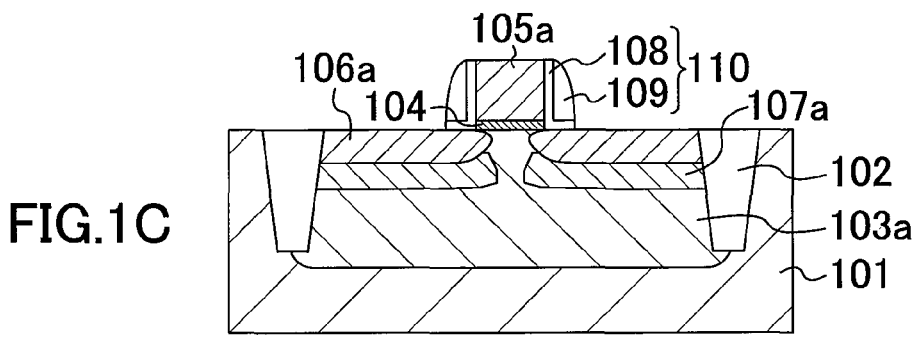
Figure 5A:
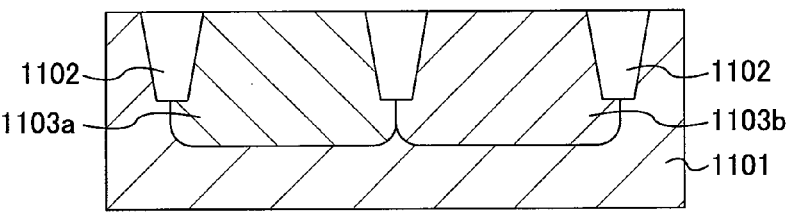
FIG. 5 A to FIG. 5E are cross sections showing a conventional fabrication method of a semiconductor device.
Figure 5B:
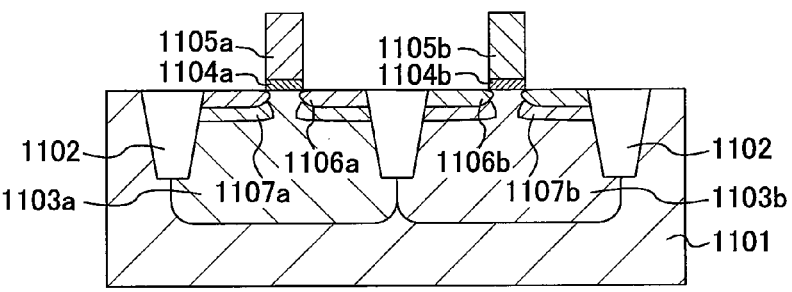
Figure 5C:
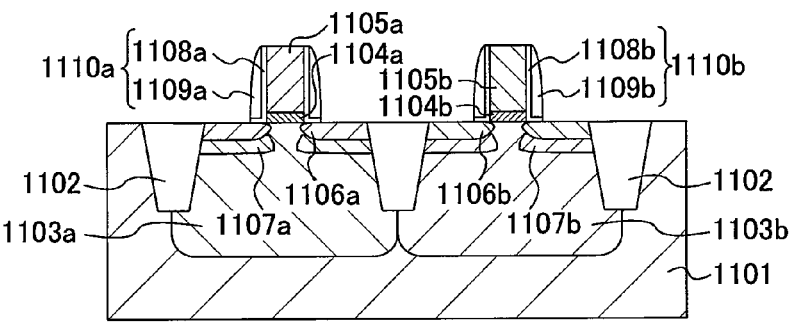
Figure 5D:
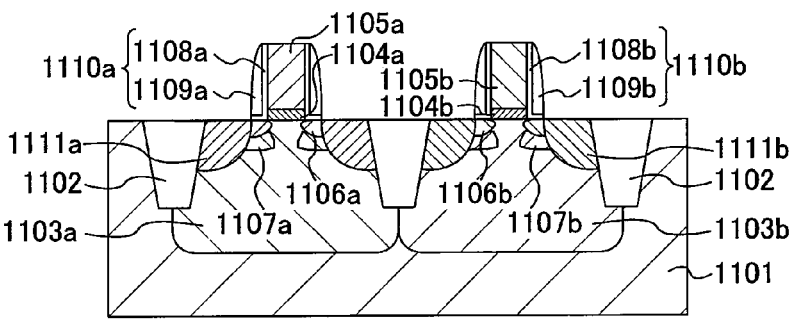
Figure 5E:
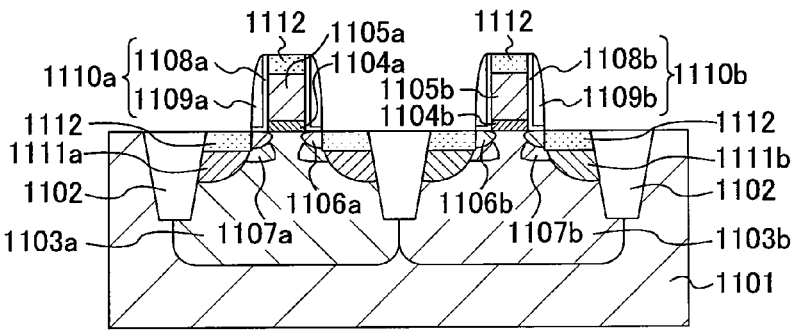
Figure 6:
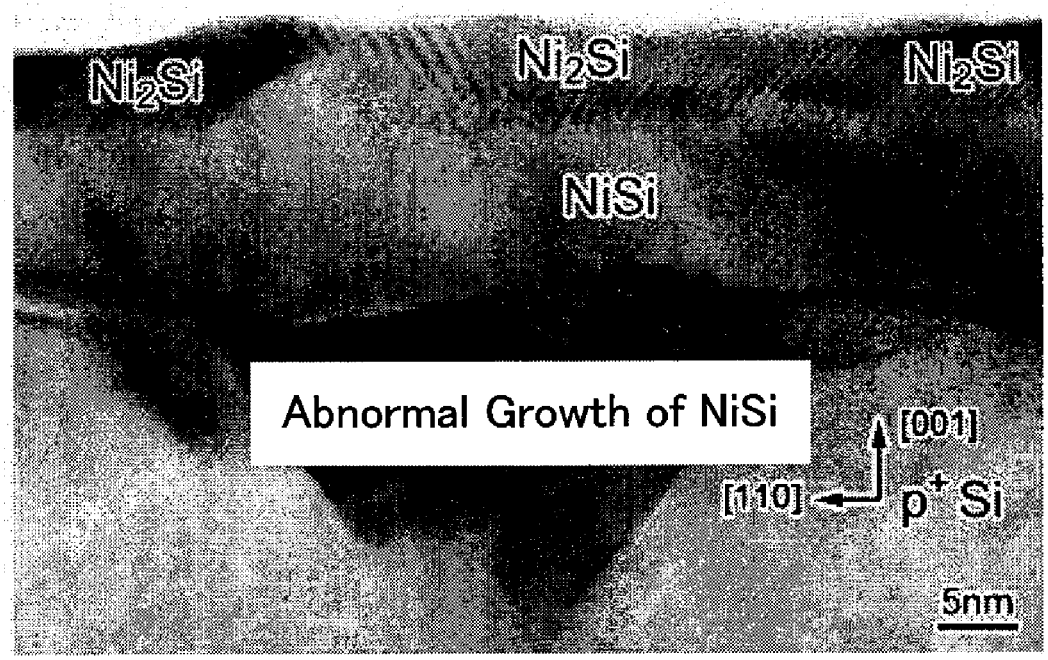
FIG. 6 is a cross sectional picture of a silicide layer of a P channel type MOS transistor formed by a conventional method.

Then, as shown in FIG. 1C, a TEOS film and a silicon nitride film are formed on the silicon substrate 101 in order. Etch back is then carried out by anisotropic etch to form a side wall 110 composed of a TEOS film 108a and a silicon nitride film 109 on side surfaces of the gate insulating film 104 and the P type gate electrode 105a. The steps above are the same as those of the conventional fabrication method shown in FIG. 5A to FIG. 5C.

Figure 1D:
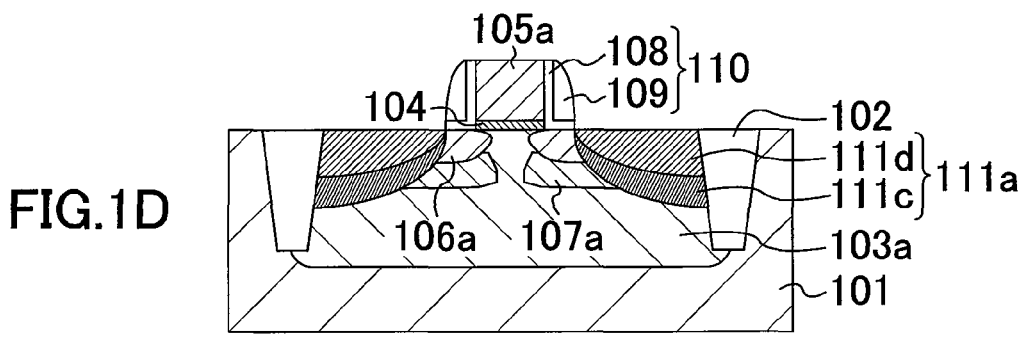

Next, as shown in FIG. 1D, photolithography and ion implantation are carried out to introduce indium in the N type well 103a using a photoresist (not shown), the P type gate electrode 105a and the side wall 110 as a mask, thereby forming first P type source/drain regions 111c. Boron is then implanted to form second P type source/drain regions 111d. The implantation conditions at this time are, for example, an acceleration energy of 30 keV and a dose of $1\times10^{15}$ cm$^{-2}$ for indium and an acceleration energy of 1.5 keV and a dose of $4\times10^{15}$ cm$^{-2}$ for boron.

In the FIG. 1D, the first P type source/drain regions 111c and the second P type source/drain regions 111d are together referred to as P type source/drain regions 111a.

If the implantation depth of the boron is deeper than that of the indium, the boron outside the indium is diffused in the semiconductor substrate 101 by a subsequent heat treatment. As a result, the junction between the semiconductor substrate 101 and the P type source/drain regions 111a is formed at a deeper portion and short-channel characteristics of the P channel type MOS transistor become deteriorated. To avoid this, boron is implanted such that the implantation depth of the boron is shallower than that of indium.

Figure 1E:
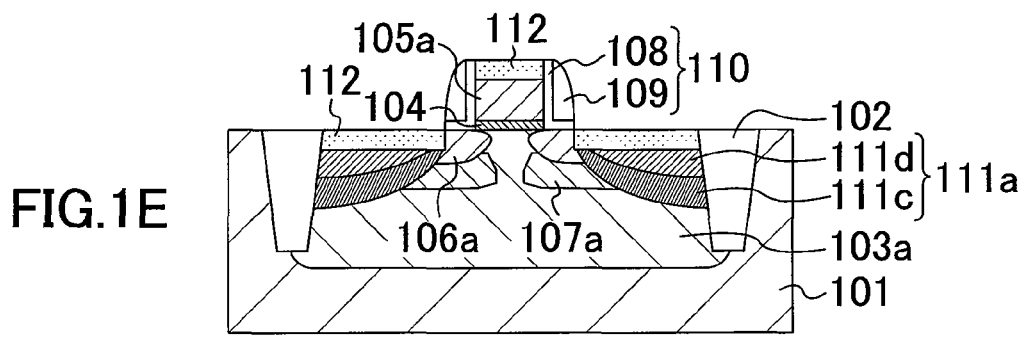

Next, as shown in FIG. 1E, the impurities introduced in the P type gate electrode 105a and the N type well 103a are activated by spike annealing. The process temperature at this time is 1050° C., for example. After that, the surface of the semiconductor substrate 101 is cleaned with a hydrofluoric acid solution, thereby removing a natural oxide film on the surface of the substrate. Then, a nickel metal film having a thickness of 9 nm, for example, and a titanium nitride (TiN) metal film having a thickness of 20 nm are formed on the semiconductor substrate 101 in order. The silicon substrate 101 is subjected to a heat treatment in a nitrogen atmosphere under the conditions of, for example, 320° C. for 30 seconds to make the nickel and silicon react with each other. The nickel metal film and the titanium nitride metal film which have not reacted with silicon are removed with a solution in which sulfuric acid and hydrogen peroxide are mixed. The silicon substrate 101 is again subjected to a heat treatment in a nitrogen atmosphere under the conditions of, for example, 550° C. for 30 seconds to form nickel silicide 112 on the P type gate electrode 105a and the P type source/drain regions 111a.

Figure 2A:
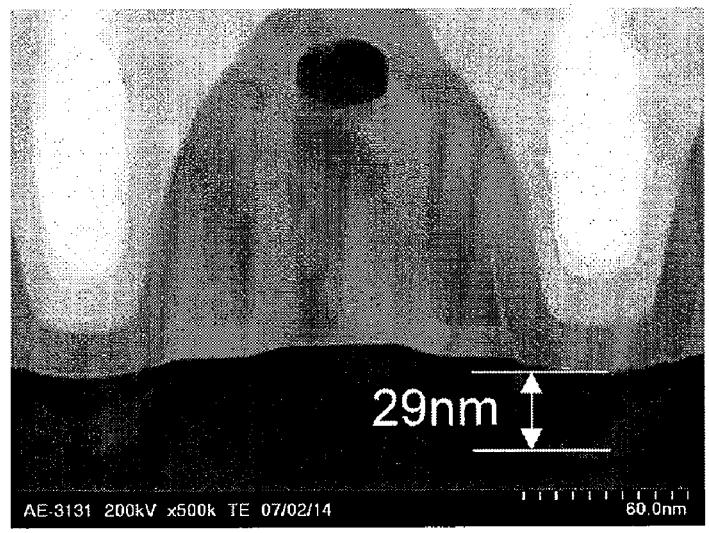
FIG. 2A is a cross sectional picture of a nickel silicide film formed on a P type source/drain region by a conventional fabrication method.
Figure 2B:
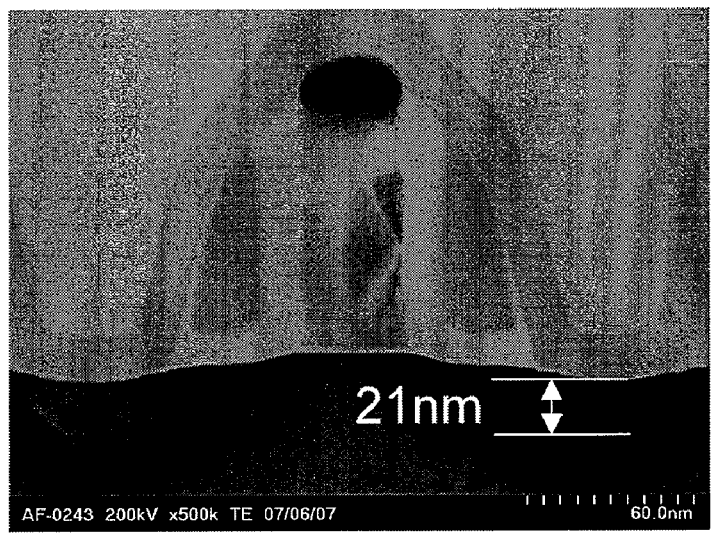
FIG. 2B is a cross sectional picture of a nickel silicide film formed on a P type source/drain region by a fabrication method of the present invention.

FIG. 2A is a cross sectional picture of a nickel silicide film formed on each of P type source/drain regions by a conventional fabrication method. FIG. 2B is a cross sectional picture of a nickel silicide film formed on each of P type source/drain regions by a fabrication method of the present invention. It is apparent from comparison between these pictures that the thickness of the nickel silicide film formed by the fabrication method of the present embodiment is thinner than the thickness of the nickel silicide film formed by a conventional fabrication method. According to the fabrication method of the present embodiment, a silicon crystal is once made amorphous and then recrystallized by a subsequent heat treatment. Crystal defects remaining in the source/drain regions can be corrected by this process. Moreover, it is considered that speed of diffusion at which the metal diffuses in the source/drain regions is slowed down because a large amount of elements larger than silicon exists in the source/drain regions. It is considered that abnormal diffusion of Ni is suppressed for this reason and that the thickness of the nickel silicide film is reduced as a result.

Figure 3:
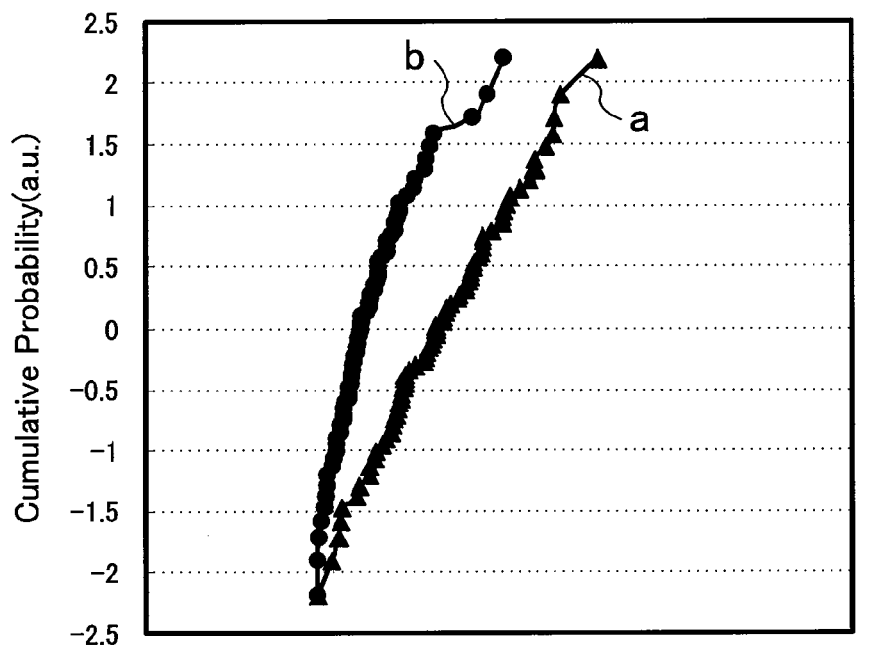
FIG. 3 shows normal probability distributions of a junction leakage current flowing from a source/drain region to a well in the respective P channel type MOS transistor arrays formed by a conventional fabrication method (line "a") and a fabrication method of the present invention (line "b").

FIG. 3 shows normal probability distributions of a junction leakage current flowing from a source/drain region to a well in the respective P channel type MOS transistor arrays formed by a conventional fabrication method (line "a") and a fabrication method of the present invention (line "b"). It is apparent from the drawing that the junction leakage current is reduced more in the P channel type MOS transistor array formed by the fabrication method of the present embodiment than the P channel type MOS transistor array formed by the conventional fabrication method.

The above results show that junction leakage current is reduced because the reduction in thickness of the nickel silicide film results in increase in the distance between the bottom surface of the nickel silicide film and the junction interface. This is an effect of the fabrication method of the present embodiment.

Figure 4:
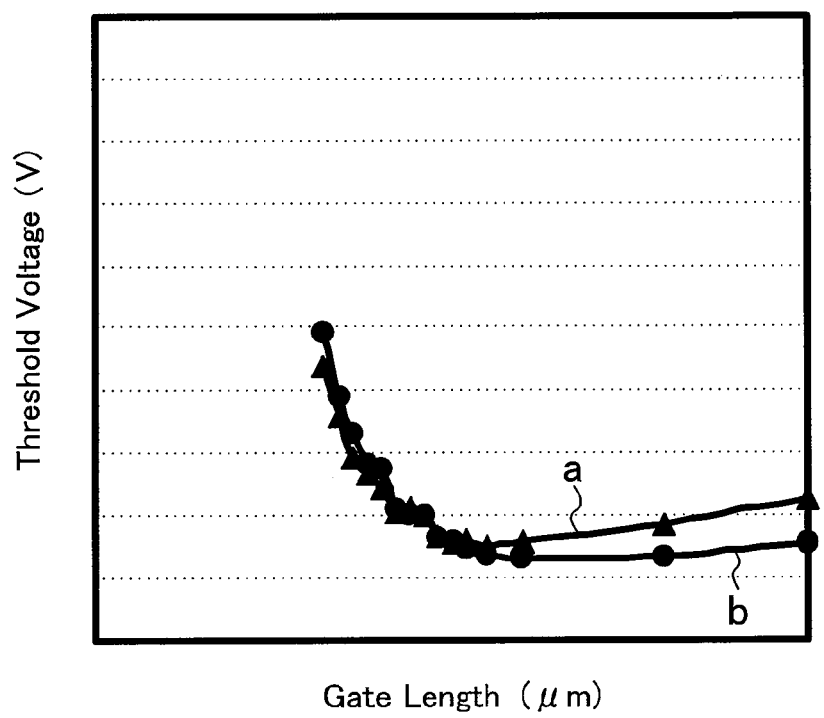
FIG. 4 shows short-channel characteristics of the respective P channel type MOS transistors formed by a conventional fabrication method (line "a") and a fabrication method of the present invention (line "b").

FIG. 4 shows short-channel characteristics of the respective P channel type MOS transistors formed by a conventional fabrication method (line "a") and a fabrication method of the present invention (line "b"). It is apparent from the drawing that the short-channel characteristics do not differ between the two fabrication methods and that shallow junction of the source/drain regions is also maintained by the fabrication method of the present invention. Thus, the fabrication method of the present embodiment is capable of suppressing abnormal growth of the silicide film and reducing leakage current, while keeping shallow junction depth of the source/drain regions.

Implantation conditions of indium are given in the above description. However, the above effect can also be obtained as long as an acceleration energy is in a range of 19 keV and 40 keV and a dose is in a range of $1\times10^{14}$ cm$^{-2}$ to $1\times10^{16}$ cm$^{-2}$. Although indium is used to form the first P type source/drain regions in the above description, the indium may be replaced with gallium which also exhibits P type conductivity in silicon and whose atomic radius is greater than that of silicon as with indium.

Further, forming nickel silicide by using a nickel metal film to which at least one or more of platinum, aluminum, copper, erbium and palladium is added does not only provide the above effect, but also improve heat resistance of the nickel silicide.

Although a gate length of the gate electrode is not specified in the fabrication method of the present embodiment, the gate length is preferably 100 nm or less because problems of a silicide film become noticeable if the gate length exceeds the figure.

As explained in the above, the method of the present invention is useful as a fabrication method of various semiconductor devices which include, for example, a P channel type MIS transistor.

The description of the embodiment of the present invention is given above for the understanding of the present invention. It will be understood that the invention is not limited to the particular embodiment described herein, but is capable of various modifications, rearrangements and substitutions as will now become apparent to those skilled in the art without departing from the scope of the invention. It is therefore intended that the following claims cover all modifications and changes which fall within the true spirit and scope of the invention.

What is claimed is:

1. A P-channel type MIS transistor comprising:
   a semiconductor substrate including an N type well surrounded by an isolation region;
   a gate electrode formed on the N type well,
   a gate insulating film disposed between said N type well and said gate electrode;
   first source/drain regions formed in regions of the N type well, one of the first source/drain regions formed on a first side of said gate electrode and another of the first source/drain regions formed on a second side of said gate electrode, said first source/drain regions including a first element, said first element being larger than silicon and exhibiting P type conductivity;

second source/drain regions formed in regions of the N type well, one of the second source/drain regions formed on said first side of said gate electrode and another one of the second source/drain regions formed on said second side of said gate electrode, said second source/drain regions including a second element, said second element being smaller than silicon and exhibiting P type conductivity; and a metal silicide layer formed on source/drain regions, said source/drain regions including the first source/drain regions and the second source/drain regions, wherein the first element is adjacent the metal silicide layer.

2. The P channel type MIS transistor of claim 1, wherein said gate electrode has a gate length of 100 nm or less.

3. The P channel type MIS transistor of claim 1, wherein the first element is indium or gallium, and the second element is boron.

4. The P channel type MIS transistor of claim 1, wherein the metal silicide layer comprises nickel silicide.

5. The P channel type MIS transistor of claim 1, further comprising:
 extension regions formed in the regions of the N type well so as to be adjacent the source/drain regions, said extension regions having a P type impurity concentration, which is lower than a P type impurity concentration of the source/drain regions; and
 a side wall formed on side faces of the gate insulating film and the gate electrode.

6. The P channel type MIS transistor of claim 1, wherein a depth of the first source/drain regions is deeper than a depth of the second source/drain regions.

7. The P channel type MIS transistor of claim 1, wherein the second source drain regions are disposed between the first source/drain regions and the metal silicide layer.

8. The P channel type MIS transistor of claim 1, wherein the metal silicide layer comprises nickel silicide to which at least one of platinum, aluminum, copper, erbium, and palladium is added.

* * * * *